(12) United States Patent
Johnson et al.

(10) Patent No.: US 6,970,047 B1
(45) Date of Patent: Nov. 29, 2005

(54) PROGRAMMABLE LOCK DETECTOR AND CORRECTOR

(75) Inventors: Phillip Johnson, Hellertown, PA (US); Gary Powell, Allentown, PA (US); William Andrews, Emmaus, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 76 days.

(21) Appl. No.: 10/628,656

(22) Filed: Jul. 28, 2003

(51) Int. Cl.[7] .............................................. H03K 5/13
(52) U.S. Cl. ............................ 331/45; 331/16; 331/18; 331/DIG. 2; 331/25; 327/158; 327/161; 327/159; 327/160; 327/156; 327/276
(58) Field of Search ................................ 327/149, 158, 327/160, 161, 263, 159, 276, 156; 331/25, 331/DIG. 2, 1 A, 16, 184.5; 375/375, 376, 375/215

(56) References Cited

U.S. PATENT DOCUMENTS

| 5,815,016 A | * | 9/1998 | Erickson ..................... 327/158 |
| 6,259,290 B1 | * | 7/2001 | Takada et al. .............. 327/158 |
| 6,504,408 B1 | * | 1/2003 | von Kaenel ................ 327/158 |
| 6,794,944 B2 | * | 9/2004 | Hirai .......................... 331/1 A |

FOREIGN PATENT DOCUMENTS

JP     2002314409 A   * 10/2002

OTHER PUBLICATIONS

Greenfield et al. "Using Microprocessors and Microcomputers: The 6800 Family", John Wiley & Sons, Inc. 1981, p. 10.*

"CMOS DLL Based 2V, 2.3ps Jitter, 1GHz Clock Synthesizer and Temperature-Compensated Tunable Oscillator," by David J. Foley, *Studen Member, IEEE, and* Michael P. Flynn, *Senior Member, IEEE*. IEEE Journal of solid state circuits vol. 36 Issue 3 Mar. 2001 pp 417-423.

* cited by examiner

Primary Examiner—Michael B Shingleton
(74) Attorney, Agent, or Firm—Steve Mendelsohn

(57) ABSTRACT

An apparatus and method for programmable lock detection and correction (PLDC) to a programmable accuracy in a digital delay-locked loop (DLL) based multiphase clock generator (MCG) is based on a DLL that utilizes a digital count to control the delay of a digitally controlled, multiple-tap delay line in its feedback path where stability of the digital count is used to qualify the determination of lock to a programmable accuracy and lock determination is based on combinatorial evaluation of the multiple phase outputs for the proper waveform relationships. The incidence of false lock corresponding to excessive delay through the delay line is addressed by a LOOPRESET signal that results in a reset of the digital count that controls the delay through the delay line. Additionally, programmability of the stability interval, the digital counter step size, and the accuracy of the lock provide control over lock acquisition time.

21 Claims, 6 Drawing Sheets

PROGRAMMABLE LOCK DETECTOR AND CORRECTOR

TECHNICAL FIELD

The present invention relates to clock-generation circuits and, more specifically, to lock detection and correction circuits.

BACKGROUND

An assortment of clock-generation circuits including clock drivers, clock multipliers, and clock synthesizers are commonly used in state-of-the-art digital systems for various applications. These applications include component-to-component and board-to-board skew compensation, high-speed serializer-deserializer systems, and on-chip/off-chip synchronizers.

These clock-generation circuits are typically built using either phase-locked loop (PLL) or delay-locked loop (DLL) techniques. More information on PLL and DLL techniques can be found Horowitz, M. A., Sidiropoulos, S., "A semi-digital dual delay-locked loop," IEEE JOURNAL OF SOLID-STATE CIRCUITS, VOL. 32, NO. 11, NOVEMBER 1997, pp 1683–1692 (herein "Horowitz '97"), incorporated herein by reference in its entirety.

Some of the issues associated with these clock-generation techniques include the rate of locking of the circuit, the determination of the locked state, and detection and correction of the incidence of false lock.

Generally, lock detection for clock-generation circuits involves comparing two counters over an interval, one driven by the reference input and the other driven by the clock generator circuit output. A matched count between the two counters at the end of the interval is typically considered a locked state. In clock-multiplication circuits, a divider is commonly placed between the clock multiplier circuit output and the output counter. In this way, a match between the input clock counter and the output counter over an interval confirms that the clock-generation circuit is multiplying the clock by the appropriate value and maintaining lock to the resolution of the interval.

In some multiphase clock-generation circuits based on DLL techniques, a multiple-output-tap, digital delay line is fed with a reference clock and the delay of the line is controlled by the voltage output of a charge pump. The charge pump is, in turn, charged or discharged by a phase detector. The phase detector compares the reference clock with the delayed version of the reference clock produced of the delay line. When the circuit is functioning properly, the phase detector charges or discharges the charge pump to adjust the delay line control-voltage so that the delay from input to output of the delay line is one period of the reference clock. In this way, each of the other taps of the delay line will correspond to a copy of the reference clock delayed by a fraction of the clock period. For example, if the clock period is T and there are N taps in the delay line, the nominal delay between taps will be T/N. As long as the overall delay is T +/- some limited error, the DLL is considered to be locked. In some circumstances, these circuits can fail to lock or may falsely lock to an improper phase or edge of a harmonic of the reference clock (e.g., harmonic lock). In this case, an approach is needed to detect and potentially correct this situation. One such approach is discussed in Foley, D. J., Flynn, M. P., "CMOS DLL Based 2V, 3.2 ps Jitter, 1 GHz Clock Synthesizer and Temperature-Compensated Tunable Oscillator," Proc. IEEE Custom Integrated Circuits Conf., May 2000, pp. 371–374 (herein "Foley '00"), incorporated herein by reference in its entirety.

SUMMARY

Problems in the prior art are addressed in accordance with principles of the present invention by an apparatus and method for programmable lock detection and correction (PLDC) to a programmable accuracy in a digital delay-locked loop (DLL) based multiphase clock generator (MCG).

In one embodiment, the MCG is based on a DLL that utilizes a digital count to control the delay of a digitally controlled, multiple-tap delay line in its feedback path. The delay line and phase detector (PD) portion of the MCG are both fed by a reference clock of period T. Each tap of the multiple-tap delay line corresponds to one phase of the multiphase clock produced by the MCG and each tap is delayed with respect to the previous by a fraction T/N (where N is the number of taps) of the delay of the delay line. The last tap out of the delay line is fed back to the PD and is ideally aligned with the rising edge of the reference clock delayed by the period T of the reference clock.

Initially the count that controls the delay line is set to zero (e.g., corresponding to a delay of less than T). If the rising edge of the delayed clock is early or late with respect to the closest rising edge of the reference clock, the count is incremented or decremented, respectively, causing a corresponding increase or decrease in the delay of the delay line. Ideally, the count is incremented until a rinsing edge of the delayed clock is roughly aligned with a rising edge of the reference clock delayed by one period. Thereafter, the count will be incremented or decremented over a small range of values as minor adjustments are needed to maintain this alignment.

In this embodiment, lock detection has two parts. The first part involves verifying that the digital count that controls the delay of the delay line is stable to a programmable accuracy over a given interval. The second part involves sampling the multiple phase taps out of the delay line and using combinatorial logic to determine whether the overall delay of the delay line falls within the predetermined lock range of the delay of the circuit. If the delay exceeds the lock range, the count is reset and the delay adjustment begins anew. This constitutes lock correction. If the delay is within the lock range and the count is also stable to the programmed accuracy over the given interval, then lock is asserted. The resulting apparatus and method thus provides programmable lock detection and correction (PLDC) of the MCG.

In another embodiment, the present invention is a clock generator that includes a phase detector, a counter, clock-generation circuitry, and a programmable lock detection and correction (PLDC) circuit. In this embodiment, (a) the clock-generation circuitry is adapted to generate a, plurality of clock signals having different relative phases based on a count value received from the counter, (b) the counter is adapted to accumulate digital control signals received from the phase detector in order to generate the count value, (c) the phase detector is adapted to compare a reference clock signal to a feedback signal derived from one of the clock signals generated by the clock-generation circuitry in order to generate the digital control signals for the counter, and (d) the PLDC circuit is adapted to determine (1) whether operations of the clock generator have settled to a stable operating point to within a programmable accuracy level and (2) whether the stable operating point corresponds to a proper lock state for the clock generator.

In another embodiment, the present invention is a programmable lock detection and correction (PLDC) circuit for a multiphase clock generator (MCG). In this embodiment, the PLDC circuit includes (a) circuitry adapted to determine whether operations of the MCG have settled to a stable operating point to within a programmable accuracy level, and (b) circuitry adapted to determine whether the stable operating point corresponds to a proper lock state for the MCG.

In yet another embodiment, the present invention is a method for monitoring operations of a multiphase clock generator (MCG), the method including determining whether operations of the MCG have settled to a stable operating point to within a programmable accuracy level, and determining whether the stable operating point corresponds to a proper lock state for the MCG.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Multiphase Clock Generator with Programmable Lock Detection and Correction

Figure 1:
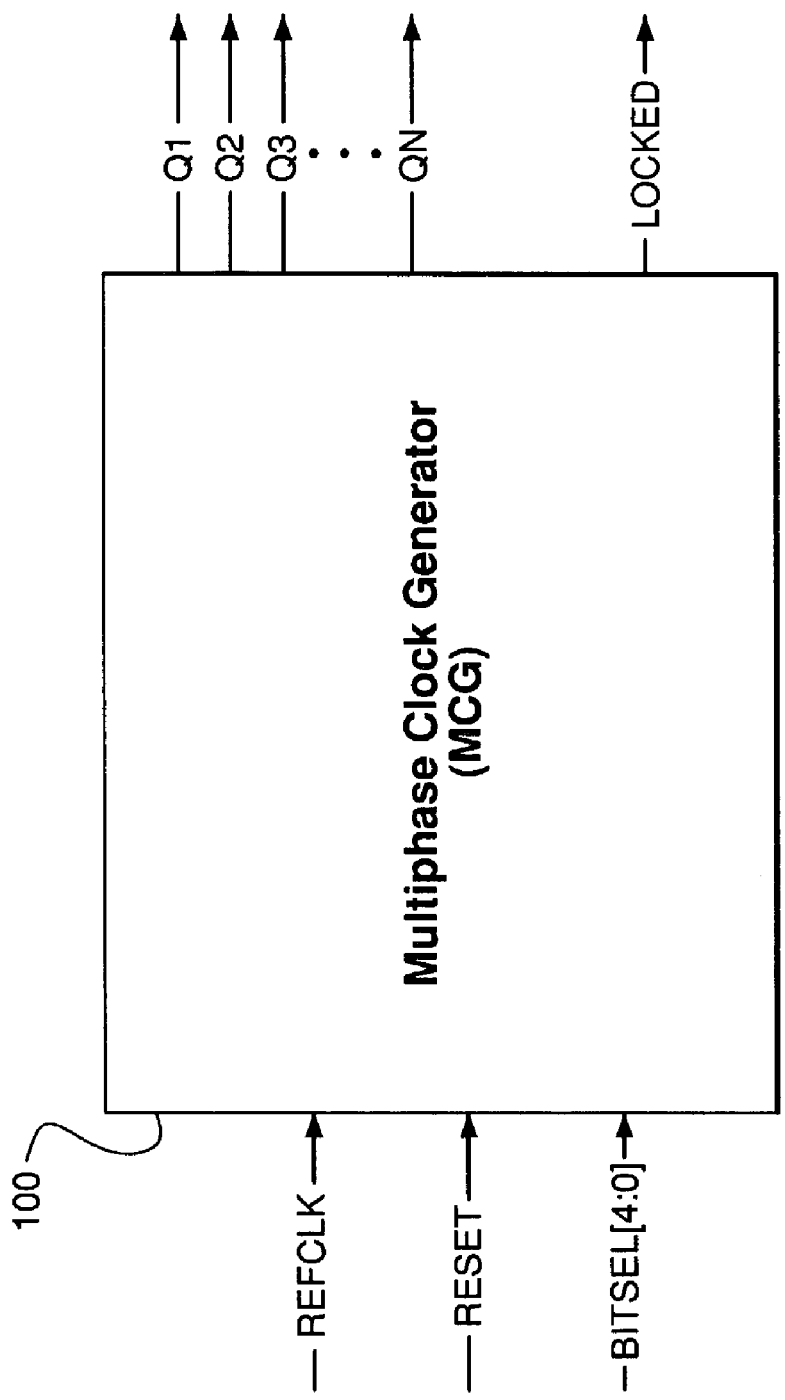
FIG. 1 is a high-level block diagram of a multiphase clock generator (MCG) 100 according to one embodiment of the present invention.

FIG. 1 depicts a generic multiphase clock generator (MCG) 100 with programmable lock detection and correction (PLDC) capability according to one embodiment of the present invention. The MCG is fed with a reference clock REFCLK of period T and produces N output clocks Q1:QN also of period T. Q1 is ideally (e.g., during lock) delayed with respect to REFCLK by T/N seconds. Additionally, each output clock Q(i) is also ideally delayed with respect to its neighboring output clock Q(i−1) (i=2, . . . ,N) by T/N seconds. Note also that, ideally, QN is delayed with respect to REFCLK by T seconds.

MCG 100 is also fed with global reset signal RESET and lock accuracy control value BITSEL[4:0]. Assertion of RESET serves to hold the output states of the digital logic of the MCG in a known state (e.g., during system power up or initialization). BITSEL[4:0] is used to control the accuracy with which the MCG determines lock. A small value for BITSEL[4:0] (e.g., BITSEL[4:0] =00000b) corresponds to a highly accurate lock, whereas a large value for BITSEL[4:0] (e.g., BITSEL[4:0]=11111b) corresponds to a coarse lock. The value selected for BITSEL[4:0] may also determine how quickly the MCG achieves lock. It may take longer, for example, to achieve a highly accurate lock than it does to achieve a coarse lock.

Once lock is achieved by the MCG, the LOCKED signal is asserted by the MCG to inform external system logic that lock has been determined to the programmed accuracy represented by BITSEL[4:0]. Note that, although BITSEL [4:0] is depicted as a 5-bit input in the embodiment of FIG. 1, it could be any finite number of bits that provides the desired range of control of the lock accuracy. As would be understood to one skilled in the art, it could also be an index to a look-up table of values, each value in the table corresponding to a different predetermined lock accuracy.

Figure 2:
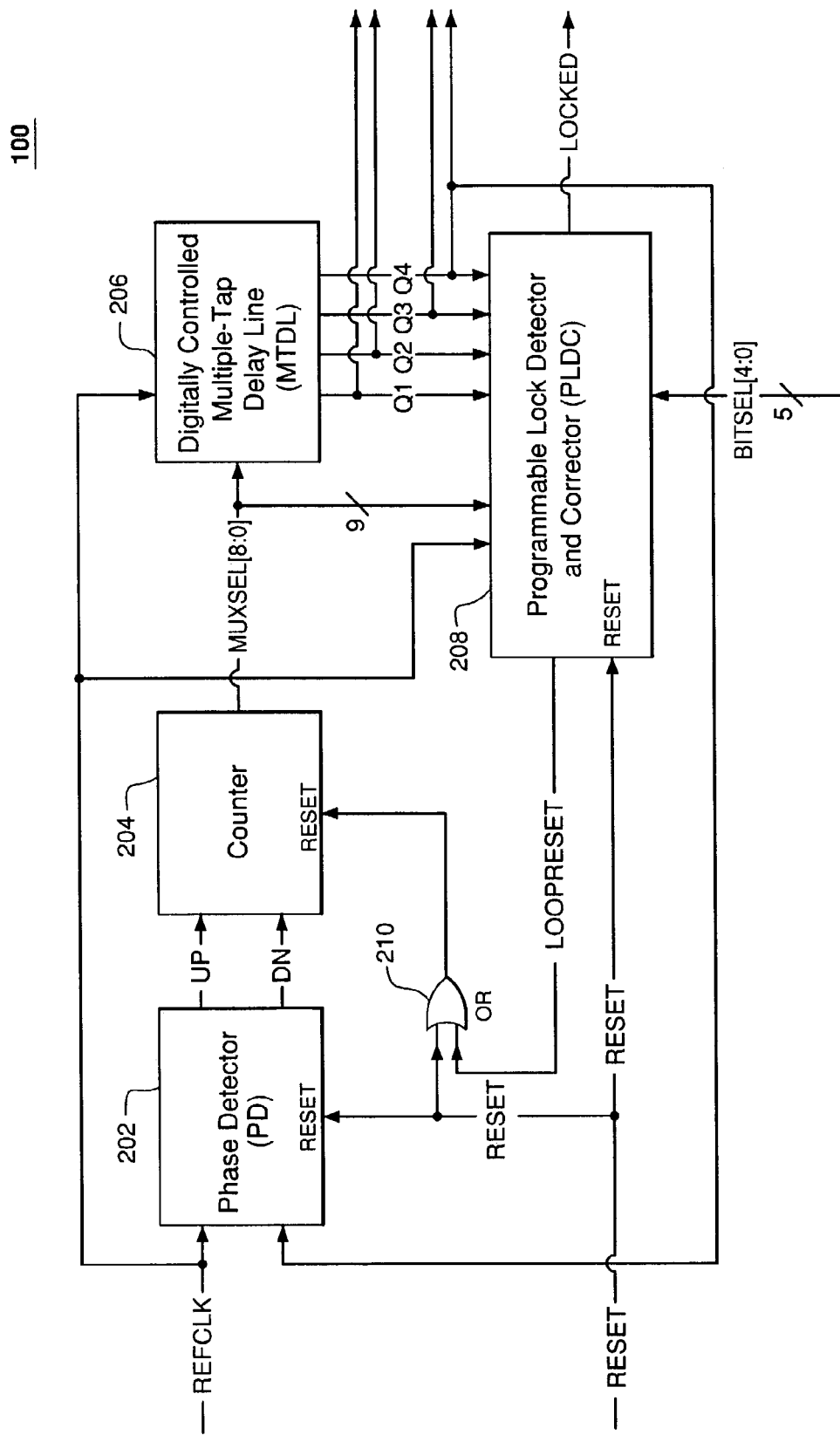
FIG. 2 is a block diagram of an exemplary implementation of MCG 100 of FIG. 1.

FIG. 2 is a block diagram of an exemplary implementation of MCG 100 of FIG. 1. It includes phase detector (PD) 202, counter 204, digitally controlled, multiple-tap delay line (MTDL) 206, programmable lock detector and corrector (PLDC) 208, and OR gate 210. Here, for simplicity of discussion, the number of clocks output from the MCG (e.g., N from FIG. 1) has been assumed to be four. In this case, Q4 will ideally be aligned with REFCLK delayed by one clock period T and REFCLK, Q1, Q2, and Q3 will be separated in time by T/4 seconds.

Note that in alternative implementations of the present invention, MTDL 206 may be replaced generically with a digitally controlled clock generation circuit, for example a digitally controlled PLL.

Operationally, PD 202 and MTDL 206 are both fed concurrently with REFCLK. In MTDL 206, REFCLK gets delayed by an overall amount determined by the 9-bit counter value MUXSEL[8:0] received from counter 204, and the last tap Q4 is fed back to PD 202 for comparison with REFCLK. The rising edge of Q4 is ideally aligned with the rising edge of REFCLK delayed by T. Initially MUX-SEL[8:0] (i.e., the count of counter 204) is set to zero (corresponding to a less than T-second overall delay through the delay line). If there is a difference between REFCLK and Q4 at PD 202, either digital control signal UP or DN is asserted by the PD to counter 204, and the count (i.e., MUXSEL[8:0]) is incremented or decremented accordingly. This causes a corresponding increase or decrease in the overall delay of the delay line. Ideally, the count i's incremented until the rising edge of Q4 is roughly aligned with REFCLK delayed by T seconds. Thereafter the count will be incremented or decremented over a small range of values as minor adjustments are made by the phase detector to maintain the alignment. Although "alignment" has been referred to in the context of the rising edges of REFCLK and Q4, alignment based on the falling edges of these signals could be used in an alternative implementation as would be understood to one skilled in the art.

Figure 3:
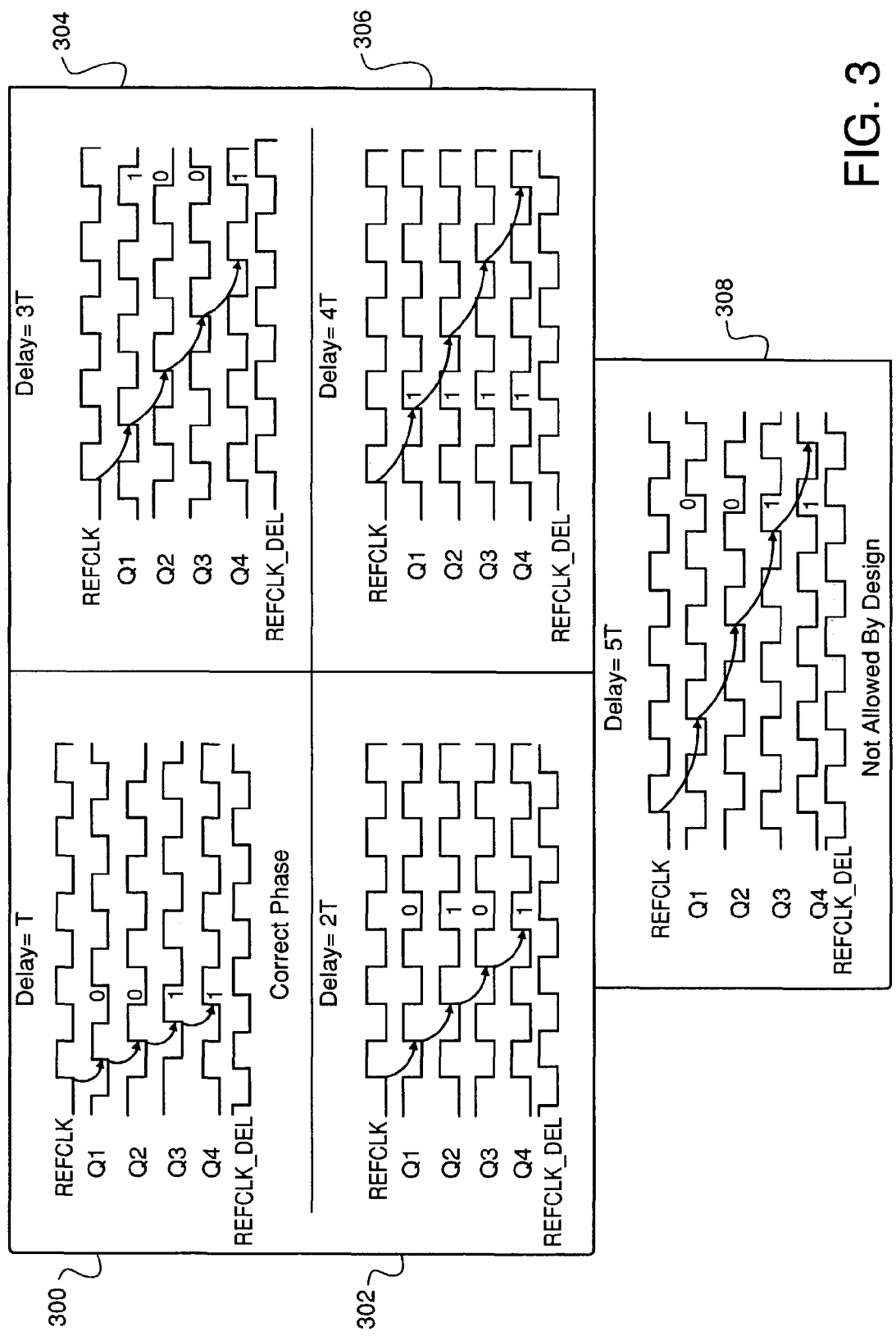
FIG. 3 depicts the relationship between REFCLK and Q1 through Q4 for various states of MCG 100 of FIG. 1

FIG. 3 depicts the relationship between REFCLK and Q1 through Q4 for various states of MCG 100 of FIG. 1. 300 represents a properly locked state where the overall delay through the MTDL is T. In practice, the DLL portion of MCG 100 may in some cases enter a state of false lock. These states typically correspond to the overall delay through the MTDL exceeding T by an integer multiple of T. States corresponding to an overall delay of 2T (302), 3T (304), 4T (306), and 5T (306) are depicted. Typically, there is a limit to the maximum delay that a particular MTDL is capable of exhibiting. In this case, it is assumed that a maximum count of 11111111b of MUXSEL[8:0] would correspond to an overall delay through the MTDL that is slightly greater than 4·T. Thus, in such a device, the false-locked state of 5T (306) would never occur.

If the device were designed to work for only one frequency (e.g., 1/T) of REFCLK, the maximum count could have been set to correspond to a period of slightly more than T and the potential for false lock could be reduced. However, because the device of this embodiment is designed to accommodate a range of frequencies above and below 1/T, MUXSEL[8:0] is configured to vary the delay of the MTDL between roughly zero and 4T, and additional logic is provided to detect the falsely locked states corresponding to the waveform relationships 302, 304, and 306. The number of bits used to control the MTDL (e.g., 9-bits in this embodiment) is chosen to provide sufficient resolution of delay and range of delay to accommodate the anticipated frequency range of REFCLK.

In an alternative implementation, counter 204 is equipped with a terminal count register. The terminal count is configured to limit the delay range of the MTDL by resetting the counter when the terminal count is reached (corresponding to the delay of the MTDL improperly exceeding the period of the reference clock during lock acquisition). In this way, some of the potential false lock states of the MCG can be eliminated.

In another alternative implementation counter 204 is equipped with lower count bound, upper count bound, and preset count inputs that can be configured during manufacture, test, or configuration of the MCG. In this alternative implementation the counter is set to the preset count upon reset and counts up or down from that count according to the controls UP or DN from PD 202. If the count exceeds the upper count bound or falls below the lower count bound substantially over a given interval, PLDC 208 asserts LOOPRESET TRUE to counter 204, otherwise if the count is within bounds for a stability interval, it asserts LOCKED.

Other alternative approaches, including calculating the terminal count or upper and lower and preset counts automatically as a function of a frequency counter applied to REFCLK (or in an FPGA implementation, as a function of the FPGA logic and inputs), could also be used, as would be understood to one skilled in the art.

In the preferred embodiment, MUXSEL[8:0], a copy of REFCLK, BITSEL[4:0], RESET, and Q1 through Q4 are fed to PLDC 208 to be used in the generation of the output indicators LOCKED and counter reset LOOPRESET. PD 202 and PLDC 208 are fed directly with global reset signal RESET, while the reset for counter 204 is fed by OR 210 based on the logical OR of the global reset and LOOPRESET.

Programmable Lock Detector and Corrector (PLDC)

Figure 4:
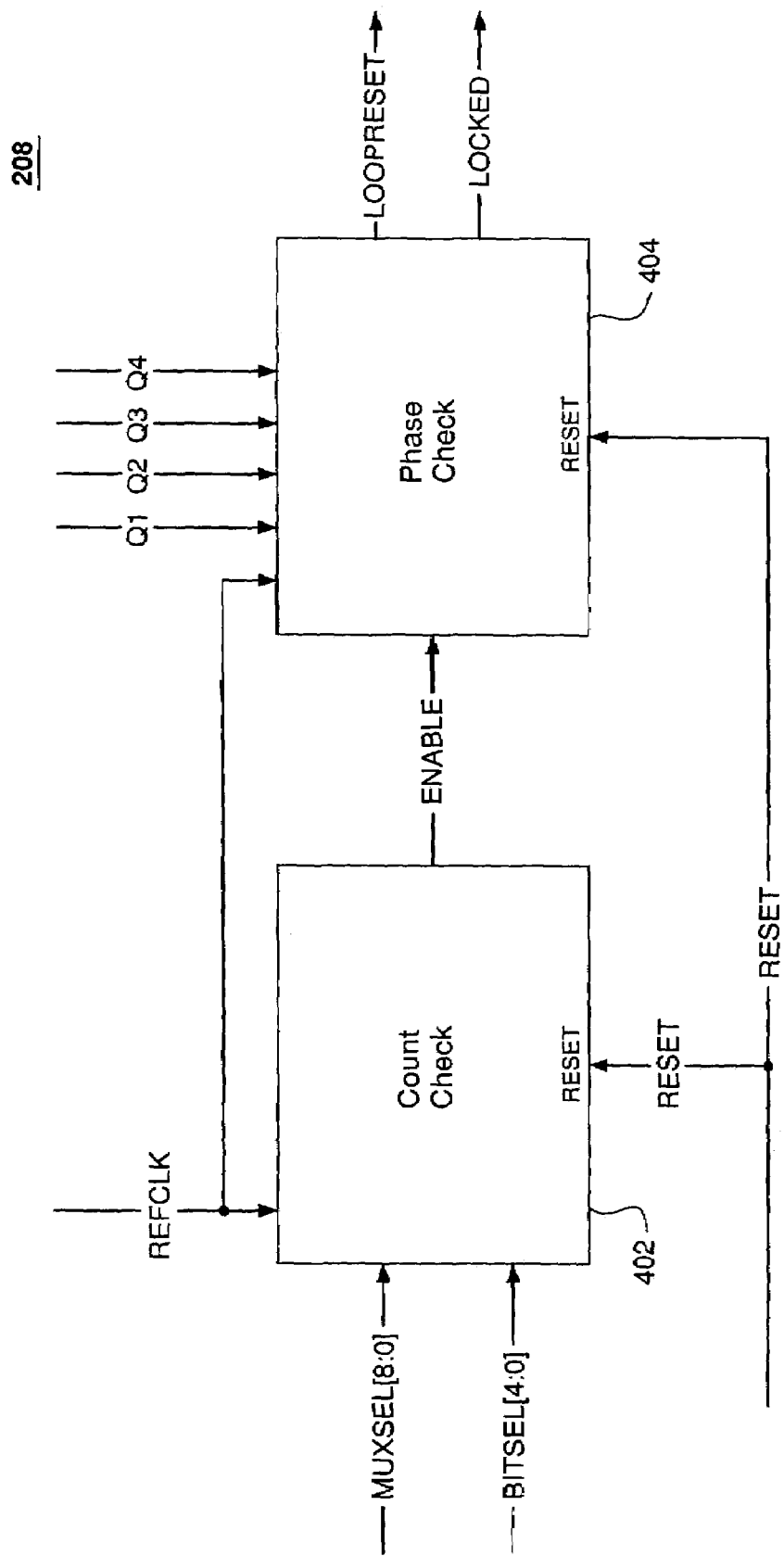
FIG. 4 is a block diagram of lock detector 208 of FIG. 2.

One possible implementation and partition of the lock detection and correction functions of PLDC 208 of FIG. 2 is depicted by the block diagram of FIG. 4. As depicted, the determination of the state of LOCKED is done in two parts within PLDC 208, count check 402 and phase check 404.

The first part of PLDC 208, count check 402, includes circuitry for verifying that MUXSEL[8:0] remains stable to an accuracy set by BITSEL[4:0] over a given interval (e.g., 16 clock cycles of REFCLK). If the count variation is bounded over the interval, it is assumed that the DLL has settled into what the PLDC believes is a locked state. In this case, count check 402 will assert ENABLE to phase check 404, and the ultimate assertion of LOCKED will be dependent on phase check 404. The state may in fact correspond to a proper locked state or it may correspond to a false lock (e.g., a "lock" to the wrong edge of REFCLK or the edge of a harmonic of REFCLK). Which one it is will be sorted out by phase check 404.

The second part of PLDC 208, phase check 404, includes circuitry for sampling taps Q1 through Q4 (e.g., using REFCLK) and combinatorial logic to determine whether the delay between REFCLK and Q4 falls within the acceptable lock range (e.g., T seconds +/− some tolerance) of the delay of the circuit. If the delay exceeds T seconds by the tolerance, then the PLDC will assert LOOPRESET to reset the count of the counter, and the delay adjustment will begin anew. This second part constitutes lock correction.

If the delay is within the lock range and the count is also stable to the programmed accuracy of the given interval, then LOCKED is asserted by the phase check circuit and multiphase clock generator 100 of FIG. 1 is considered to be locked.

Count Check

Figure 5:
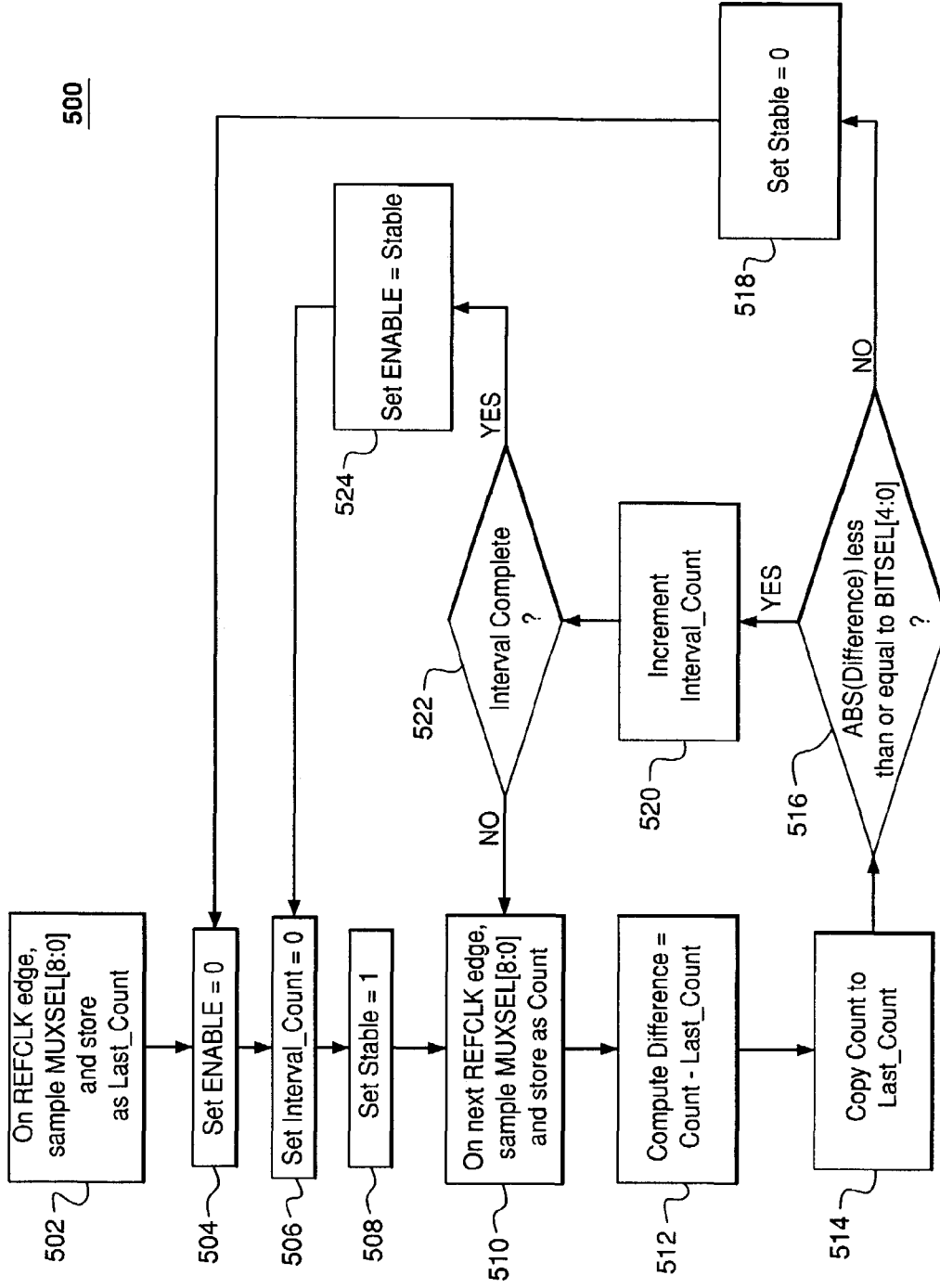
FIG. 5 depicts flow diagram 500 of an exemplary implementation of the count check module (402) of FIG. 4.

One possible implementation for count check 402 of FIG. 4 is depicted by flow diagram 500 of FIG. 5. At the beginning of an update interval, in step 502, at the rising edge of REFCLK, the output signal MUXSEL[8:0] from counter 204 (FIG. 2) is sampled and stored in the variable Last_Count. Following this, in steps 504 and 506, both the ENABLE signal and an internal variable Interval_Count, respectively, are initialized to zero. Then, in step 508, the variable Stable is initialized to 1. In step 510, at the next edge of REFCLK, MUXSEL[8:0] is again sampled and this time the result is stored in the variable Count. In step 512 the difference between Count and Last_Count is computed and stored, and in step 514 the variable Count is assigned the value of Last_Count. In step 516 the absolute value of Difference is compared with the value of BITSEL[4:0].

If the difference is greater than BITSEL[4:0], it means the DLL is not sufficiently stabilized. In this case the variable Stable is set to zero in step 518 and control returns to step 504 where ENABLE is cleared. Following this, control proceeds to step 506 where Interval_Count is reinitialized to zero and a new update interval commences.

If in step 516 the difference is less than or equal to BITSEL[4:0], then Interval_Count is incremented in step 520 and a test is done in step 522 to see if the interval is complete.

If the interval is complete, then ENABLE is assigned the current value of the variable Stable in step 524 and control returns to step 506 where Interval_Count is reinitialized to zero and a new update interval commences. Otherwise, control continues to step 510 where at the next edge of REFCLK a new Count value is assigned based on the sampled value of MUXSEL[8:0] followed by the differencing, copying, and test steps of 512, 514, and 516, respectively, followed by the rest of the processing chain already described. Note that the inner loop of 510, 512, 514, 516, 520, and 522 continues until an unstable or inaccurate lock is detected or until the interval completes. If the interval completes without the detection of a difference that exceeds the programmed accuracy of the lock as controlled by BITSEL[4:0], then ENABLE gets set to one and the circuitry of phase check block 404 (FIG. 4) is enabled.

Phase Check

Figure 6:
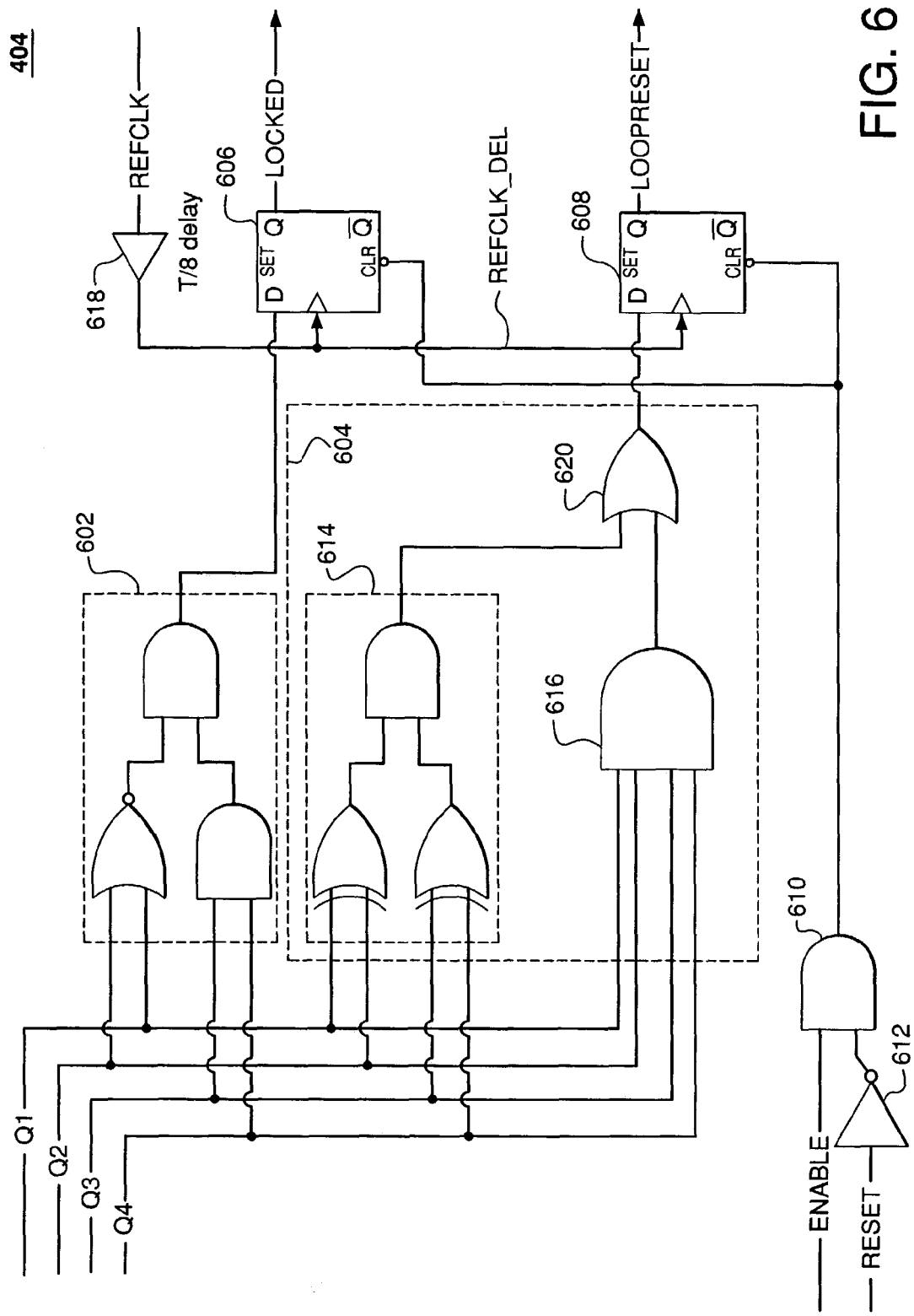
FIG. 6 is a logic diagram representing one possible implementation of the phase check module (404) of FIG. 4.

FIG. 6 is a logic diagram representing one possible implementation of phase check circuit 404 of FIG. 4. It includes locked indicator combinatorial block 602, locked indicator D-type FF (D-FF) 606, loop reset combinatorial logic block 604, loop reset D-FF 608, AND gate 610, inverter gate 612, and buffer gate 618. Note that D-FFs 606 and 608 sample on the rising edge of REFCLK_DEL.

REFCLK_DEL is a copy of REFCLK delayed an incremental amount (e.g., ⅛T) by buffer gate 618 to guarantee, that the D-FFs sample incrementally after the rising edge of REFCLK.

The overall operation of the phase check circuit is dependent on (1) the global reset RESET being FALSE and (2) ENABLE being TRUE. Assuming this is the case, LOCKED is asserted TRUE by D-FF 606 when the logic of combinatorial block 602 outputs a TRUE incrementally after the rising edge of REFCLK. This corresponds to when Q1 and Q2 are FALSE and Q3 and Q4 are TRUE at or before the rising edge of REFCLK. Note that this is only the case when multiphase clock generator 100 of FIG. 1 is in a properly locked state corresponding to an overall, delay through multiple-tap delay line 206 of FIG. 2 of T seconds. This corresponding to waveform relationship 302 of FIG. 3.

The assertion of LOOPRESET TRUE is determined by the combinatorial logic block 604. Block 604 includes upper logic block 614 and lower logic block EJ, each of which feeds an input of OR gate 620. For LOOPRESET to be asserted, it is sufficient that either one of the blocks EJ or 614 outputs a TRUE incrementally after the rising edge of REFCLK.

Regarding LOOPRESET, referring again to FIG. 6, the logic of block 604 will resolve to TRUE when the logic of logic block 614 resolves to TRUE or the output of AND gate 616 resolves to TRUE.

The logic of block 614 resolves to TRUE when the relationship (Q2.XOR.Q3)*(Q1.XOR.Q4) is TRUE. This is the case when Q1 differs from Q2 and Q3 differs from Q4. This corresponds to the improperly locked states represented by waveform relationships 302 and 304 of FIG. 3.

The logic of block EJ will resolve to TRUE when the Boolean AND of Q1, Q2, Q3, and Q4 is TRUE. This corresponds to the improperly locked state represented by the waveform relationship 306 of FIG. 3.

Note that even though the waveform relationship 306 of FIG. 3 would result in a TRUE out of combinatorial logic block 602, this waveform relationship is guaranteed not to occur by the delay limitations built into the MTDL design.

In an alternative implementation, the logic for LOOPRESET (i.e., the logic that drives the input of D-FF 608 may be replaced with the complement of the logic for LOCKED (i.e. the logic out of logic block 602.

In an alternative embodiment, logic and control may be added to the MCG that detects the specific pattern and takes appropriate action with respect to the counter. For example, if the pattern corresponding to a delay of 2T is detected (corresponding to the pattern 0101 of the waveform relationship 302 of FIG. 3), the count may be cut in half to achieve a value that is very close to lock. This method can be applied to other cases as well (e.g., detecting the pattern corresponding to 3T and dividing the count by three) to overcome the problem of the MCG false locking to harmonics of the period T.

The present invention has been described in the context of digital implementations. Those skilled in the art will understand that some or all of the components could be implemented using analogous analog circuitry.

The programmability of the MCG should be evident from the various exemplary embodiments in this document. Additionally, in an FPGA implementation, various elements of the MCG (e.g., frequency, BITSEL[4:0], and number of phases considered in phase check block 404 of FIG. 4) may be programmed via the FPGA fabric (i.e., the results of Boolean and registered logic and inputs) as would be understood to one skilled in the art.

While this invention has been described with reference to illustrative embodiments, this description should not be construed in a limiting sense. Various modifications of the described embodiments, as well as other embodiments of the invention, which are apparent to persons skilled in the art to which the invention pertains are deemed to lie within the principle and scope of the invention as expressed in the following claims.

Note that certain elements or embodiments of this invention may have been described with respect to an operational flow or variables suggestive of a software implementation. These descriptions were for illustrative purposes and should not be interpreted in a limiting sense. As is understood to one skilled in the art, various elements of the present invention may be implemented in software, firmware, hardware, or programmable logic as best suits the implementation constraints.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

Note that without loss of generality, the programmable lock detection and correction concepts of this invention could be applied to either PLL or DLL based implementations. In a PLL implementation, the delay line 206 of FIG. 2 is replaced with a digitally controlled oscillator wherein the multiple clock phases used by the phase check circuit are found and one or more of those signals may constitute outputs of the circuit.

The present invention also applies to a broad range of related PLL- and DLL-based devices in addition to the multiphase clock generator example provided by FIG. 1. including frequency multipliers and clock distribution or buffer circuits.

What is claimed is:
1. A clock generator, comprising:
(a) a phase detector;
(b) a counter;
(c) clock-generation circuitry; and
(d) a programmable lock detection and correction (PLDC) circuit, wherein:
the clock-generation circuitry is adapted to generate a plurality of clock signals having different relative phases based on a count value received from the counter;
the counter is adapted to accumulate digital control signals received from the phase detector in order to generate the count value;
the phase detector is adapted to compare a reference clock signal to a feedback signal derived from one of the clock signals generated by the clock-generation circuitry in order to generate the digital control signals for the counter;
the PLDC circuit receives an input control signal specifying one of a plurality of different possible input control values, each input control value corresponding to one of a plurality of different possible programmable accuracy levels; and
the PLDC circuit is adapted to determine (1) whether operations of the clock generator have settled to a stable operating point to within the programmable accuracy level corresponding to the input control value specified by the input control signal and (2) whether the stable operating point corresponds to a proper lock state for the clock generator.

2. The invention of claim 1, wherein:
the clock-generation circuitry is a digitally controlled, multiple-tap delay line; and
the phase detector, counter, and clock-generation circuitry form a delay-locked loop.

3. The invention of claim 1, wherein the PLDC circuit comprises:
a count check circuit adapted to compare the difference between count values over a specified time period to the input control value corresponding to the programmable accuracy level to determine whether or not the operations of the clock generator have settled to a stable operating point; and
a phase check circuit adapted to compare the reference clock to the two or more clock signals from the clock-generation circuitry to determine whether or not the stable operating point corresponds to a proper lock state for the clock generator.

4. The invention of claim 3, wherein the specified time period is programmable and the count value is based on a counter step size that is programmable.

5. The invention of claim 3, wherein the phase check circuit performs its operations only after the count check circuit has determined that the operations of the clock generator have settled to a stable operating point.

6. The invention of claim 3, wherein the count check circuit compares the count value at two or more instances during the specified period to compute difference values, wherein when substantially all difference values are less than or equal to the control value for the comparisons during the specified period, an enable signal is asserted toward the phase check circuit, the signal indicating to the phase check circuit that the operations of the clock generator have settled to a stable operating point.

7. The invention of claim 3, wherein the phase check circuit includes:
a first block of combinatorial logic adapted to determine the state of a LOCKED output signal from a first flip-flop based on a first Boolean function of the two or more clock signals, wherein when the waveform relationships of the two or more clock signals indicate that the feedback signal is of substantially the same period as the reference clock, LOCKED is asserted TRUE;
a second block of combinatorial logic adapted to determine the state of a LOOPRESET output signal from a second flip-flop based on a second Boolean function of the two or more clock signals, wherein when the waveform relationships of the two or more clock signals indicate that the feedback signal is not of substantially the same period as the reference clock, LOOPRESET is asserted TRUE; and
a third block of combinatorial logic adapted to determine a clear signal for the first and second flip-flops based on a third Boolean function of an enable signal and a reset signal.

8. The invention of claim 1, wherein the PLDC generates a control signal that causes the counter to reset the count value when the PLDC determines that the stable operating point corresponds to an improper lock state for the clock generator.

9. A programmable lock detection and correction (PLDC) circuit for a multiphase clock generator (MCG), the PLDC circuit comprising:
circuitry that receives an input control signal specifying one of a plurality of different possible input control values, each input control value corresponding to one of a plurality of different possible programmable accuracy levels;
circuitry adapted to determine whether operations of the MCG have settled to a stable operating point to within the programmable accuracy level corresponding to the input control value specified by the input control signal; and
circuitry adapted to determine whether the stable operating point corresponds to a proper lock state for the MCG.

10. The invention of claim 9, wherein the MCG comprises a phase detector; a counter; and clock-generation circuitry, wherein:
the clock-generation circuitry is adapted to generate a plurality of clock signals having different relative phases based on a count value received from the counter;
the counter is adapted to accumulate digital control signals received from the phase detector in order to generate the count value;
the phase detector is adapted to compare a reference clock signal to a feedback signal derived from one of the clock signals generated by the clock-generation circuitry in order to generate the digital control signals for the counter.

11. The invention of claim 10, wherein:
the clock-generation circuitry is a digitally controlled, multiple-tap delay line; and
the phase detector, counter, and clock-generation circuitry form a delay-locked loop.

12. The invention of claim 10, wherein the PLDC circuit comprises:
a count check circuit adapted to compare the difference between count values over a specified time period to the input control value corresponding to the programmable accuracy level to determine whether or not the operations of the clock generator have settled to a stable operating point; and
a phase check circuit adapted to compare the reference clock to the two or more clock signals from the clock-generation circuitry to determine whether or not the stable operating point corresponds to a proper lock state for the clock generator.

13. The invention of claim 12, wherein the specified time period is programmable.

14. The invention of claim 13, wherein the count value is based on a counter step size that is programmable.

15. The invention of claim 12, wherein the phase check circuit performs its operations only after the count check circuit has determined that the operations of the clock generator have settled to a stable operating point.

16. The invention of claim 12, wherein the count check circuit compares the count value at two or more instances during the specified period to compute difference values, wherein when substantially all difference values are less than or equal to the control value for the comparisons during the specified period, an enable signal is asserted toward the phase check circuit, the signal indicating to the phase check circuit that the operations of the clock generator have settled to a stable operating point.

17. The invention of claim 12, wherein the phase check circuit includes:
a first block of combinatorial logic adapted to determine the state of a LOCKED output signal from a first flip-flop based on a first Boolean function of the two or more clock signals, wherein when the waveform relationships of the two or more clock signals indicate that the feedback signal is of substantially the same period as the reference clock, LOCKED is asserted TRUE;

a second block of combinatorial logic adapted to determine the state of a LOOPRESET output signal from a second flip-flop based on a second Boolean function of the two or more clock signals, wherein when the waveform relationships of the two or more clock signals indicate that the feedback signal is not of substantially the same period as the reference clock, LOOPRESET is asserted TRUE; and a third block of combinatorial logic adapted to determine a clear signal for the first and second flip-flops based on a third Boolean function of an enable signal and a reset signal.

18. The invention of claim 10, wherein the PLDC generates a control signal that causes the counter to reset the count value when the PLDC determines that the stable operating point corresponds to an improper lock state for the clock generator.

19. A method for monitoring operations of a multiphase clock generator (MCG), comprising:

receiving an input control signal specifying one of a plurality of different possible input control values, each input control value corresponding to one of a plurality of different possible programmable accuracy levels;

determining whether operations of the MCG have settled to a stable operating point to within the programmable accuracy level corresponding to the input control value specified by the input control signal; and determining whether the stable operating point corresponds to a proper lock state for the MCG.

20. The invention of claim 19, wherein the MCG comprises:

(a) a phase detector;
(b) a counter;
(c) clock-generation circuitry; and
(d) a programmable lock detection and correction (PLDC) circuit, wherein:

the clock-generation circuitry is adapted to generate at least one output clock signal having a relative phase based on a count value received from the counter;

the counter is adapted to accumulate digital control signals received from the phase detector in order to generate the count value;

the phase detector is adapted to compare a reference clock signal to a feedback signal output from the clock-generation circuitry in order to generate the digital control signals for the counter; and the PLDC circuit is adapted to determine (1) whether operations of the clock generator have settled to a stable operating point to within the programmable accuracy level and (2) whether the stable operating point corresponds to a proper lock state for the clock generator, wherein the determining involves comparing the count to a lower and upper count bound and resetting the counter to a starting count value if the count is less than the lower count bound or is greater than the upper count bound.

21. A programmable lock detection and correction (PLDC) circuit for a multiphase clock generator (MCG), the PLDC circuit comprising:

a count check circuit adapted to compare a difference between count values within the MCG to an input control value corresponding to a user-programmable accuracy level to determine whether the MCG has settled to a stable operating point; and a phase check circuit adapted to compare a reference clock for the MCG to two or more clock signals generated by the MCG to determine whether the stable operating point corresponds to a proper lock state for the MCG.

* * * * *